United States Patent

Hugel et al.

[11] 4,217,503
[45] Aug. 12, 1980

[54] CURRENT LIMITER

[75] Inventors: Philippe Hugel, Illkirch Graffenstaden; Henri Kraess, Strasbourg; Rémi Louis, Erstein; Louis Vidonne, Sallanches, all of France

[73] Assignee: Societe Anonyme dite: La Telephonie Industrielle et Commerciale-TELIC, Strasbourg, France

[21] Appl. No.: 917,230

[22] Filed: Jun. 20, 1978

[30] Foreign Application Priority Data

Jun. 30, 1977 [FR] France .................. 77 20075

[51] Int. Cl.² ............................................. H03K 5/08
[52] U.S. Cl. ...................................... 307/237; 328/171
[58] Field of Search ............... 307/237, 321, 264; 328/171, 172, 173; 325/482; 179/16 AA, 70, 77

[56] References Cited

U.S. PATENT DOCUMENTS

| | | | |
|---|---|---|---|
| 2,803,703 | 8/1957 | Sherwin | 307/321 X |
| 3,027,466 | 3/1962 | Roalef | 307/237 |

FOREIGN PATENT DOCUMENTS 708559  5/1931  France .

*Primary Examiner*—John Zazworsky
*Attorney, Agent, or Firm*—Sughrue, Rothwell, Mion, Zinn and Macpeak

[57] ABSTRACT

A current limiter such as a thermistor has a slow response time and inserts appreciable loss to normal signal currents that do not need limiting. The present invention uses a diode quad (6,7,8 and 9) arranged in a full-wave rectifier configuration. The AC terminals of the quad are inserted in series in the circuit whose current is to be limited. The DC terminals are connected to receive a DC bias current from a constant current source (P, R1). A signal from a signal generator (1) flows through a load (2) substantially unhindered by the current limiter until its instantaneous valve reaches that of the bias current I, in which case the signal current is clipped regardless of the direction of its current flow because the signal current cancels the bias current flowing through two of the diodes thereby reverse biasing them and effectively switching the current through the constant current generator. For practical telephone applications it suffices if the resistance (R1) of the bias source is at least ten times that of the load (2).

2 Claims, 2 Drawing Figures

CURRENT LIMITER

The present invention relates to a current limiter for limiting the amount of current which an arbitrary signal can cause to flow in an electric circuit.

Thermistors with a positive temperature co-efficient and connected in series in the circuit to be protected are known for use in this connection. However, the reponse time of a thermistor is generally too long for it to provide adequate protection against short disturbances and furthermore the permanent overload which a thermistor can withstand is small in comparison to the maximum current it is capable of passing. Also a thermistor increases the total electrical resistance of the circuit thereby reducing the nominal current of the circuit and such a reduction is not always acceptable.

Preferred embodiments of the present invention provide a current limiter capable of limiting the amount of current which an arbitrary signal can cause to flow in the secondary windings of a transformer while having a low resistance in normal operation.

The present invention provides a current limiter for limiting the current flowing in the secondary windings of a transformer having two windings, the current limiter comprising a four diode bridge and a source of DC bias current, the bridge being arranged as a full wave rectifying diode quad with a pair of AC terminals and a pair of DC terminals, the DC terminals being connected to the source of DC bias current and the AC terminals being connected between said two secondary windings of the transformer, the limiting value of the current flowing through the AC terminals being determined by the DC bias current.

An embodiment of the invention is described by way of example with reference to the accompanying drawing in which.

Figure 1:
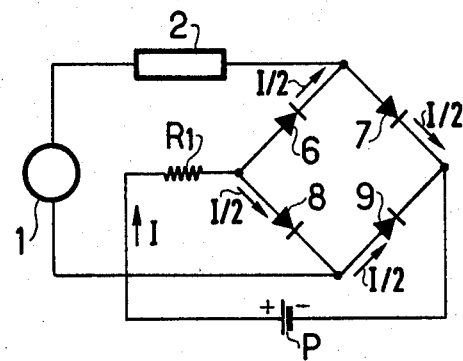
FIG. 1 is a circuit diagram of the basic current limiter.

FIG. 1 is a circuit diagram of a current limiter capable of limiting the amount of current which an arbitrary signal can cause to flow in either direction in an electric circuit. A signal generator 1 feeds a load 2 via the current limiter which is constituted by a four-diode bridge (diodes 6, 7, 8 and 9) and a source of DC bias current, P, $R_1$. The four diodes 6, 7, 8 and 9 are arranged in a full-wave rectifying quad with a pair of AC terminals, i.e. the points common to the respective pairs of diodes 6 and 7, and 8 and 9, and a pair of DC terminals, i.e. the points common to the respective pairs of diodes 6 and 8, and 7 and 9. The AC terminals are connected in series between the load 2 and the generator 1. The source of DC bias current is connected to cause a current I to flow from one DC terminal to the other. Each diode of the bridge is thus DC biased and has a direct current I/2 flowing therethrough. The current delivered by the generator 1 splits into two portions in the bridge, one portion flowing through the diodes 7 and 9 in series and the other portion flowing through the diodes 6 and 8 in series. As long as the current delivered by the generator 1 is less than the current I delivered by the DC source, all the diodes remain forward biased and the current delivered by the generator 1 is not clipped. When the current delivered by the generator 1 exceeds the value I both portions of the current flowing from one AC terminal to the other are clipped by one or other of the diodes in the said series connections, depending on the direction of current flow. During clipping the current which flows through the load 2 is limited to I provided that the source of DC bias current is a perfect constant current generator. In practice, for the telephone application described below, the source approximates to a perfect constant current source sufficiently provided that the resistance of the source (symbolized by a resistor R1) is at least ten times as great as the resistance of the load 2. The potential then needed to drive the required current I through the resistance $R_1$ can then be calculated form Ohm's law.

The current limiter shown in FIG. 1 can thus be seen to clip unwanted current peaks in either direction through the load 2, while having substantially no effect on the passage of below-threshold value currents therethrough. An important application of the limiter is in telephony and an example of this use is described below with reference to FIG. 2.

Figure 2:
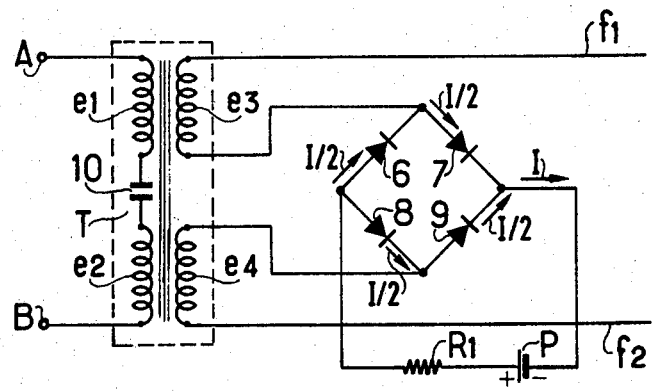
FIG. 2 shows an embodiment of the invention incorporating the limiter of FIG. 1 in use in a telephone circuit.

In FIG. 2 a transformer of known type T has two primary windings e1 and e2 connected to each other in series by a capacitor 10 and having their ends connected to the A and B terminals of a telephone subscriber. The secondary winding of the transformer T is connected to the exchange via a line constituted by wires f1 and f2. The secondary winding is constituted by two windings e3 and e4 each having one end connected to a respective one of the wires f1 and f2 and connected in series via the AC terminals of the current limiter as shown in FIG. 1. The potential P in the DC bias source is 48 volts. In normal operation the current flowing through the wires f1 and f2 is less than the direct current flowing in the bias circuit. However, if a fault occurs on the line constituted by the wires f1 and f2, thereby reducing the resistance of that line, or if the signal at the terminals A and B of the transformer increases abnormally, the current flowing through the wires f1 and f2 increases until clipped at the value of the direct current flowing through the bias circuit.

The current limiter has a very high impedance once the signal current reaches the value of the DC bias; in fact once the DC flowing in one of the diodes cancels, the impedance of the diode becomes very large. But in normal operation the impedance presented by a forward biased diode is low and is known as its dynamic resistance Rd. Thus in contrast with the thermistor whose resistance increases with current, thereby limiting the amount of current which can flow through the circuit, the limiter of the present invention provides substantially no attenuation of a signal as such but only clips it when the current delivered is excessive. No temperature related effects are observed as with a thermistor. Further, the response time of the current limiter in accordance with the present invention is substantially nil whatever the applied signal, this also is not the case with a thermistor.

The current limiter also operates when there is interference on a circuit since such interference normally has an impulse form. The limiter shown in FIGS. 1 and 2 limits the current of such impulse noise regardless of the direction of flow of the noise current. In FIG. 2, the noise signal could be present on the wires f1 and f2 or at the primary winding of the transformer, but in either case the current limiter limits the amplitude of the current regardless of the direction of current flow.

We claim:

1. A current limiter for limiting the current flowing in the secondary windings of a transformer having two windings, the current limiter comprising a four diode bridge and a source of DC bias current, the bridge being arranged as a full wave rectifying diode quad with a pair of AC terminals and a pair of DC terminals, the DC terminals being connected to the source of DC bias current and the AC terminals being connected between said two secondary windings of the transformer, the limiting value of the current flowing throught the AC terminals being determined by the DC bias current.

2. A current limiter according to claim 1 wherein the transformer is a subscriber circuit transformer.

* * * * *